US009442025B2

(12) United States Patent
Yang et al.

(10) Patent No.: US 9,442,025 B2
(45) Date of Patent: Sep. 13, 2016

(54) SYSTEM AND METHOD FOR CALIBRATING TEMPERATURES SENSOR FOR INTEGRATED CIRCUITS

(71) Applicant: Apple Inc., Cupertino, CA (US)

(72) Inventors: Yizhang Yang, Sunnyvale, CA (US); Jun Zhai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 456 days.

(21) Appl. No.: 14/066,942

(22) Filed: Oct. 30, 2013

(65) Prior Publication Data

US 2015/0117486 A1   Apr. 30, 2015

(51) Int. Cl.
G01K 15/00 (2006.01)
G01K 3/04 (2006.01)
G01K 7/01 (2006.01)

(52) U.S. Cl.
CPC .............. *G01K 15/005* (2013.01); *G01K 7/01* (2013.01)

(58) Field of Classification Search
CPC .. G01N 25/18; G01N 25/00; G01N 25/4866; G01K 7/01; G01K 7/425; G01K 15/00; G01K 3/04; G01K 3/06; G01K 7/00
USPC ....... 374/100, 102, 43–45, 4, 5, 1, 152, 170, 374/178, 137, 166, 110, 111, 112, 163; 327/512, 513; 702/130, 99; 324/750.03
See application file for complete search history.

(56) References Cited

U.S. PATENT DOCUMENTS 4,713,612 A * 12/1987 Takamine .......... G01R 31/2837
324/750.08
5,927,853 A * 7/1999 Christiaens ............ G01N 25/18
374/43

(Continued)

FOREIGN PATENT DOCUMENTS

KR         100953441 B1 *  4/2010

OTHER PUBLICATIONS

Poirier et al., "Power and Temperature Control on a 90nm Itanium-Family Processor", IEEE International Solid State Circuits Conference, Session 16, Feb. 8, 2005, 2 pages, Intel Corp., Fort Collins, CO, USA.

*Primary Examiner* — Gail Kaplan Verbitsky
(74) *Attorney, Agent, or Firm* — Meyertons, Hood, Kivlin, Kowert & Goetzel, P.C.; Lawrence J. Merkel; Neal E. Persky

(57) ABSTRACT

In some embodiments, a method may be provided for calibrating integrated circuit temperature sensors. The method may include sensing a first temperature using a first temperature sensor and a second temperature using a second temperature sensor. The first temperature sensor may be calibrated and is external to a package of the integrated circuit. The second temperature sensor may be included in the integrated circuit. The method may include increasing a temperature of the integrated circuit. The method may include allowing the integrated circuit and the package to thermally equilibrate over a first period of time. The method may include sensing a first slope of a temperature decay by the first temperature sensor. The method may include sensing a second slope of a temperature decay by the second temperature sensor. The method may include calibrating the second temperature sensor responsive to a difference between the first and second temperatures and the first and second slopes.

20 Claims, 3 Drawing Sheets

(56) References Cited

U.S. PATENT DOCUMENTS

| | | | |
|---|---|---|---|
| 5,994,752 A | 11/1999 | Sander et al. | |
| 6,160,755 A | 12/2000 | Norman et al. | |
| 6,225,141 B1* | 5/2001 | Wenner | G01K 15/00 |
| | | | 361/748 |
| 6,853,259 B2 | 2/2005 | Norman et al. | |
| 6,984,064 B1* | 1/2006 | Touzelbaev | G01K 7/425 |
| | | | 374/178 |
| 7,087,439 B2 | 8/2006 | Ku | |
| 7,569,904 B2 | 8/2009 | Oh et al. | |
| 7,831,873 B1 | 11/2010 | Trimberger et al. | |
| 8,633,550 B2* | 1/2014 | Uno | H01L 23/49524 |
| | | | 257/365 |
| 8,665,592 B2* | 3/2014 | Mowry | G06F 1/206 |
| | | | 165/104.33 |
| 2001/0021217 A1* | 9/2001 | Gunther | G01K 7/015 |
| | | | 374/178 |
| 2007/0046369 A1 | 3/2007 | Schober et al. | |
| 2011/0110396 A1* | 5/2011 | Grayson | G01K 1/026 |
| | | | 374/178 |
| 2011/0252984 A1* | 10/2011 | Chung | G01K 7/01 |
| | | | 99/483 |
| 2013/0076381 A1 | 3/2013 | Takayanagi et al. | |
| 2013/0090888 A1* | 4/2013 | Anderson | G06F 1/203 |
| | | | 702/130 |
| 2013/0110437 A1 | 5/2013 | Singh et al. | |
| 2014/0036953 A1* | 2/2014 | Kimura | G01J 5/16 |
| | | | 374/121 |
| 2014/0062533 A1 | 3/2014 | Takayanagi | |
| 2015/0168268 A1* | 6/2015 | Fish | G05B 23/0235 |
| | | | 374/142 |
| 2015/0371699 A1* | 12/2015 | Lee | G11C 11/40626 |
| | | | 365/189.07 |

* cited by examiner

SYSTEM AND METHOD FOR CALIBRATING TEMPERATURES SENSOR FOR INTEGRATED CIRCUITS

BACKGROUND

1. Technical Field

This disclosure relates generally to semiconductor devices, and more particularly to stackable die modules.

2. Description of the Related Art

Conventional systems on a chip (SoC) package on the temperature sensor calibration methods correlate the sensor output (e.g., voltage) to reference temperature set-points to yield a sensor calibration curve. The sensor calibration curve includes a slope and offset for linear response temperature sensors. Such calibration is typically carried out in thermal chamber/liquid bath environment in order to achieve uniform ambient temperature. Power levels inside the silicon have to be minimized to eliminate any on die temperature gradient and junction to ambient temperature difference. The major disadvantage of this steady-state calibration approach is the slow throughput due to (1) the large thermal mass of the thermal chamber itself that results in a very large equilibration time to reach a given temperature set point, especially at high temperature ranges, and (2) a slow thermal equilibrium between SoC packages and ambient temperatures due to thermal mass of a package/PCB board assembly. The current methodology for calibration typically takes ~30-60 minutes.

SUMMARY

In one embodiment, a method may be provided for more efficiently calibrating integrated circuit temperature sensors. The method may include a quick on-die temperature sensor calibration. The method may be based on the large thermal time constant contrast between a package and the rest of the system. The method may use package transient heating curves to calibrate the on-die temperature. The method may include using a calibrated temperature sensor positioned externally to an integrated circuit in a package to calibrate a temperature sensor in the integrated circuit.

In some embodiments, a method may be provided for calibrating integrated circuit temperature sensors. The method may include sensing a first temperature using a first temperature sensor and a second temperature using a second temperature sensor. The first temperature sensor may be calibrated and is external to a package of the integrated circuit. The second temperature sensor may be included in the integrated circuit. The method may include increasing a temperature of the integrated circuit. The method may include allowing the integrated circuit and the package to thermally equilibrate over a first period of time. The method may include sensing a first slope of a temperature decay by the first temperature sensor. The method may include sensing a second slope of a temperature decay by the second temperature sensor. The method may include calibrating the second temperature sensor responsive to a difference between the first and second temperatures and the first and second slopes.

BRIEF DESCRIPTION OF THE DRAWINGS

The following detailed description makes reference to the accompanying drawings, which are now briefly described.

Figure 1:
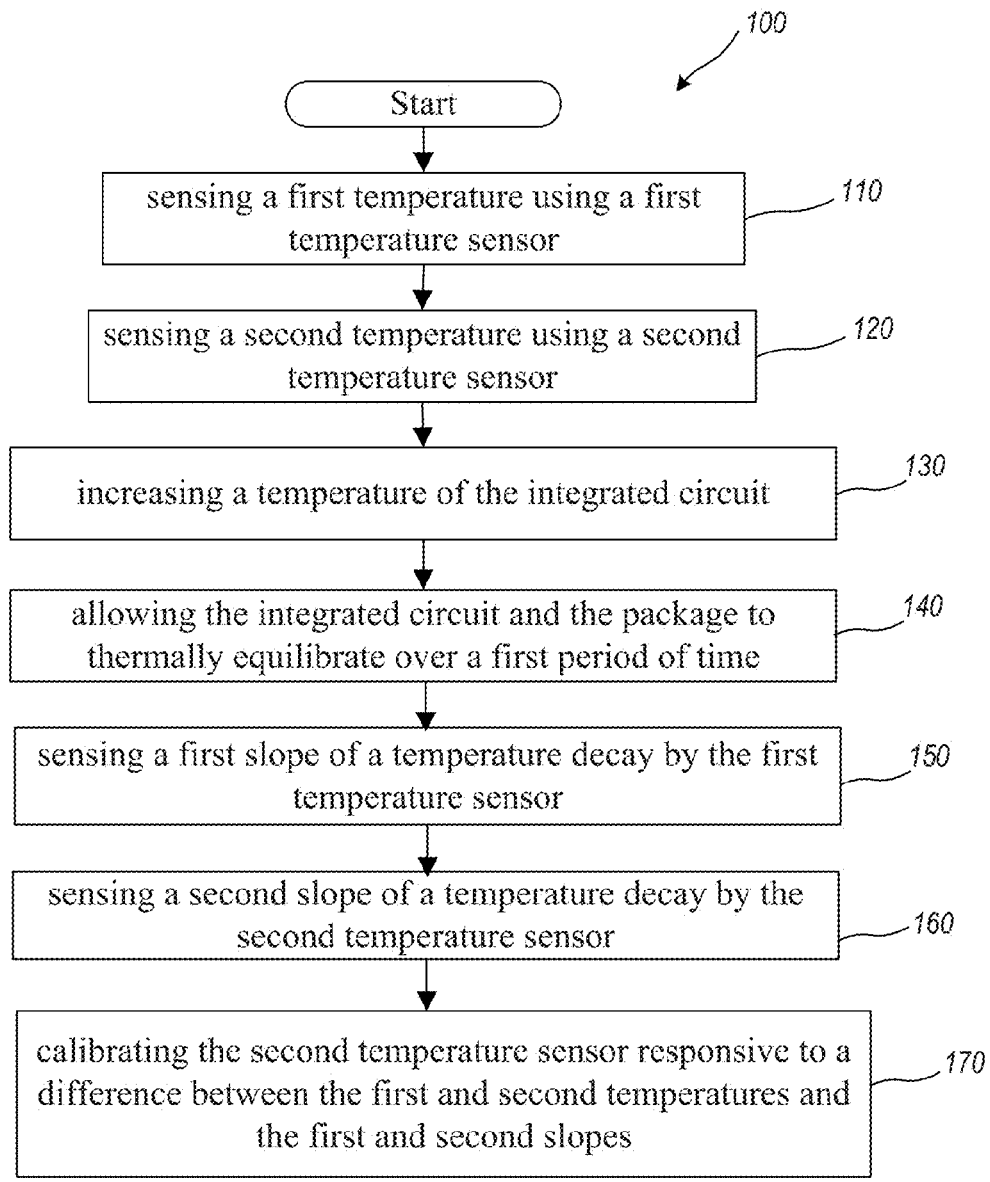
FIG. 1 depicts an embodiment of a flow chart representing a method for calibrating integrated circuit temperature sensors.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112, paragraph six, interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

FIG. 1 depicts an embodiment of flow chart representing a method 100 for calibrating integrated circuit temperature sensors. The method may include sensing 110 a first temperature using a first temperature sensor. The method may include sensing 120 a second temperature using a second temperature sensor.

The first temperature sensor may be calibrated prior to invoking the method of FIG. 1, and may be external to a package of the integrated circuit. The first temperature sensor may have been previously calibrated to sense temperatures accurately within predetermined acceptable limits. In some embodiments, the first temperature sensor may be coupled to an exterior surface of the package of the integrated circuit. In some embodiments, the first temperature sensor may be coupled to a substrate to which the package is coupled. An example of such a substrate may include a circuit board to which the package is coupled. In some embodiments, there may be multiple external temperature sensors.

In some embodiments, the second temperature sensor is initially uncalibrated. The second temperature sensor may be included in the integrated circuit. The second temperature sensor may be positioned in the package and coupled to the integrated circuit. In some embodiments, the integrated circuit may include multiple second temperature sensors, and each of the second temperature sensors may have a separate calibration, although they may be done in parallel in the method.

The method may include increasing 130 a temperature of the integrated circuit. In some embodiments, increasing the temperature of the integrated circuit may include increasing an applied voltage to the integrated circuit such that the temperature of the integrated circuit is increased. In some embodiments, increasing the temperature to the integrated circuit may include executing a power-intensive program on a processor included in the integrated circuit. Running a recursive algorithm may be power-intensive and thus may cause the temperature of the integrated circuit to increase. A recursive algorithm may allow for a more regulated and reproducible temperature increase. The temperature of the integrated circuit may be increased to a predetermined point or increased a certain predetermined amount or the temperature may be increased for a predetermined period of time.

In some embodiments, after the temperature of the integrated circuit has been increased to an acceptable level the applied voltage may be decreased and/or the power-intensive program may be terminated. The applied voltage may be reduced to minimal levels allowing operation of the processor and associated temperature sensors. The applied voltage may not be reduced to a point such that the associated temperature sensors may not operate.

In some embodiments, the method may include allowing 140 the integrated circuit and the package to thermally equilibrate over a first period of time. After the applied voltage to the integrated circuit has decreased the temperature of the integrated circuit and the package as well as anything coupled to the package will begin to decrease in temperature. The temperature will decrease eventually to a point substantially equivalent to ambient room temperature. The first period of time may include a predetermined period of time. The integrated circuit and the package may be allowed to thermally equilibrate for ~5 seconds (s), 10 s, 30 s, or 1 minute for example. The first period of time may allow for the rates of temperature decay of the integrated circuit and the package and/or external portion to which the calibrated temperature sensor is coupled to equilibrate.

In some embodiments, the method may include sensing 150 a first slope of a temperature decay by the first temperature sensor. In some embodiments, sensing a first slope may include sensing at least a third and a fourth temperature over a second period of time using the first temperature sensor. A line may be drawn between the measured third and fourth temperatures. A slope of the line may be determined using standard means calculating a slope of the line. For example, the slope may be calculated using the equation $m=(Y_1-Y_2)/(X_1-X_2)$ wherein X represents a time at which a temperature Y was sensed by the temperature sensor.

In some embodiments, a slope may be determined by sensing multiple temperatures. In general, the more temperatures sensed may lead to more accurately determining temperature decay. When dealing with a multitude of data points, curve fitting methods may be used to determine the temperature decay. Curve fitting is the process of constructing a curve, or mathematical function, which has the best fit to a series of data points, possibly subject to constraints. Curve fitting may involve either interpolation, where an exact fit to the data is required, or smoothing, in which a "smooth" function is constructed that approximately fits the data.

In some embodiments, the method may include sensing 160 a second slope of a temperature decay by the second temperature sensor. Sensing a second slope may include sensing at least a fifth and a sixth temperature over a third period of time using the second temperatures sensor. In some embodiments, the second slope may be determined by sensing temperatures. A slope of the line may be determined using standard means calculating a slope of the line as described herein.

Figure 2:
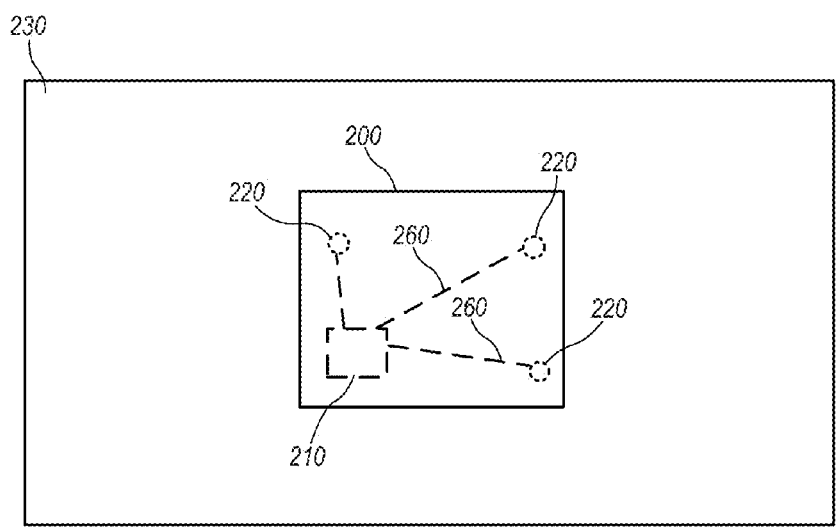
FIG. 2 depicts an embodiment of an integrated circuit including a processor and multiple internal temperature sensors.
Figure 3:
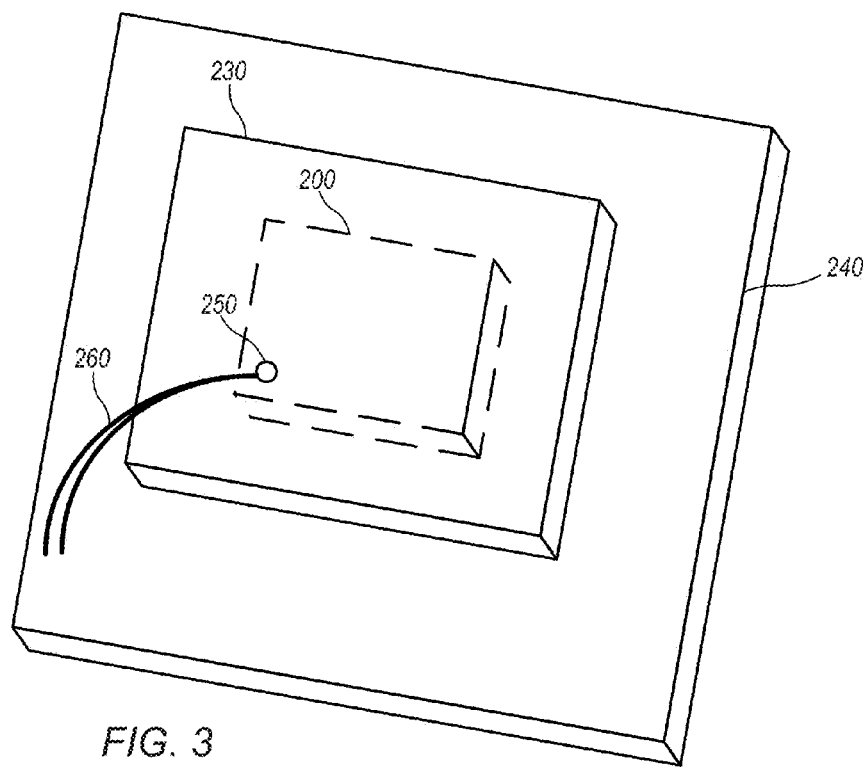
FIG. 3 depicts an embodiment of an integrated circuit coupled to a circuit board including a temperature sensor mounted externally to the integrated circuit.

FIG. 2 depicts an embodiment of an integrated circuit 200 including a processor 210 and multiple internal temperature sensors (e.g., second temperature sensors 220). Integrated circuit 200 may be positioned in package 230. Second temperature sensors 220 may be coupled 260 to processor 210. FIG. 3 depicts an embodiment of integrated circuit 200 coupled to a circuit board 240 including a temperature sensor (e.g., first temperature sensor 250) mounted externally to the integrated circuit. First temperature sensor 250 may be coupled 260 to the circuit board. Processor 210 may be configured to issue read commands to the temperature sensors 220 to read a sensed temperature. Thus each temperature sensor 220 may include circuitry to sense the temperature and circuitry to convert the temperature sensor output to a number that represents the sensed temperature (e.g., in degrees Fahrenheit or Celsius, or even Kelvin). The temperature sensor may return the number in response to the read command. The read command may be generated in the processor by executing a load instruction to an address to which the temperature sensor is mapped.

In some embodiments, the second period of time and the third period of time may be substantially equivalent.

The method may include calibrating 170 the second temperature sensor responsive to a difference between the first and second temperatures and the first and second slopes.

In some embodiments, calibrating the second temperature sensor may include using the first temperature and the first slope as a standard and adjusting for differences between the first temperature and the first slope and the second temperature and the second slope. For example, initial temperature readings may be used to calculate the initial temperature offset (e.g., calibration offset=Temp 1−Temp 2). While the calculated slopes may be used to determine the slope offset (e.g., slope offset=slope of line 1−slope of line 2).

In some embodiments, the method may include burning in a correction in the second temperature sensor using the calibration.

Figure 5:
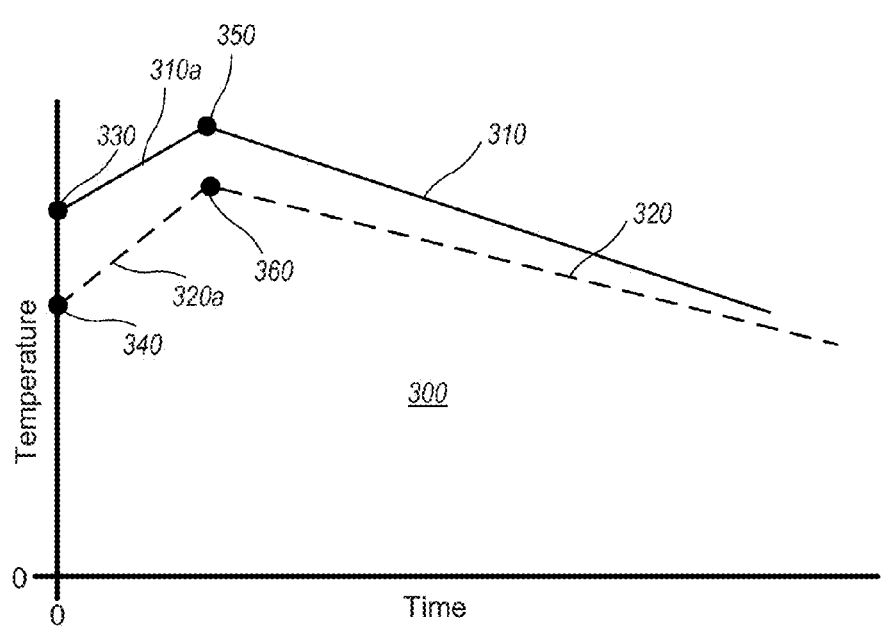
FIG. 5 depicts an embodiment of a graph plotting temperature readings over time from a calibrated external temperature sensor and an uncalibrated internal temperature sensor.

FIG. 5 depicts an embodiment of a graph 300 plotting temperature readings over time from a calibrated external temperature sensor 310 and an uncalibrated internal temperature sensor 320. Portions 310a and 320a may represent a time when an applied voltage is increased such that the temperature increases. Points 350 and 360 may represent when the applied voltage is decreased to nominal levels such that the temperature begins to decrease. Initial temperature readings 330 and 340 may be used to calculate the initial temperature offset (e.g., calibration offset=Temp 330−Temp 340). While the calculated slopes of lines 310 and 320 may be used to determine the slope offset (e.g., slope offset=slope of line 310−slope of line 320). The initial temperature offset and the slope offset may then be used to determine a correction factor for the uncalibrated temperature sensor.

Figure 4:
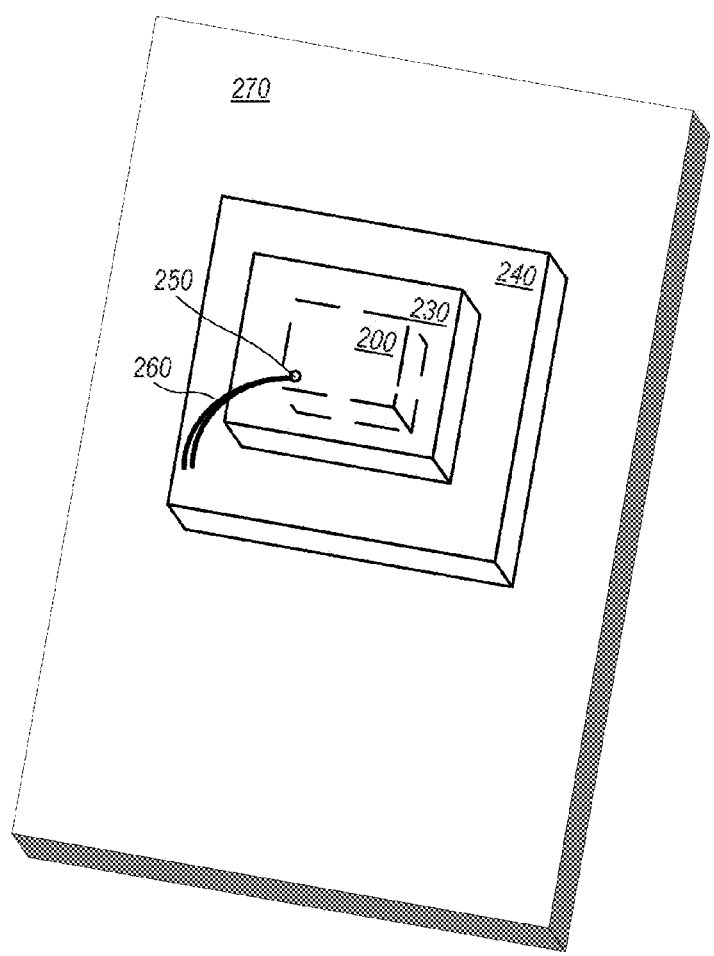
FIG. 4 depicts an embodiment of a mobile device including an integrated circuit coupled to a circuit board including a temperature sensor mounted externally to the integrated circuit.

There may be many advantages to the method of calibrating temperatures sensors over the currently-used methods. One advantage may be the greater speed at which the temperature sensors are calibrated, greatly increasing production. Another advantage may be that temperature sensors may be more easily calibrated later during an assembly process into which the integrated circuit is incorporated. FIG. 4 depicts an embodiment of a mobile device 270 including integrated circuit 200 in package 230 coupled to circuit board 240 including temperature sensor 250 mounted externally to the integrated circuit and coupled 260 to the circuit board. As depicted in FIG. 4 temperatures sensors as calibrated using the method as described herein may be used in any number of devices, including mobile devices (e.g., cell phones, tablets, etc.).

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for calibrating integrated circuit temperature sensors, comprising:
    sensing a first temperature using a first temperature sensor and a second temperature using a second temperature sensor, wherein the first temperature sensor is calibrated and is external to a package of the integrated circuit, and wherein the second temperature sensor is included in the integrated circuit;
    increasing a temperature of the integrated circuit;
    allowing the integrated circuit and the package to thermally equilibrate over a first period of time;
    sensing a first slope of a temperature decay by the first temperature sensor;
    sensing a second slope of a temperature decay by the second temperature sensor;
    comparing the first temperature to the second temperature to determine a temperature offset;
    comparing the first slope to the second slope to determine a slope offset; and
    calibrating the second temperature sensor using the temperature offset and the slope offset.

2. The method of claim 1, wherein said increasing comprises increasing an applied voltage to the integrated circuit such that the temperature of the integrated circuit is increased.

3. The method of claim 1, wherein said increasing comprises executing a power intensive program on a processor included in the integrated circuit.

4. The method of claim 1, wherein the second temperature sensor is initially uncalibrated.

5. The method of claim 1, wherein said sensing a first slope comprises sensing at least a third and a fourth temperature over a second period of time using the first temperature sensor.

6. The method of claim 5, wherein said sensing a second slope comprises sensing at least a fifth and a sixth temperature over a third period of time using the second temperatures sensor.

7. The method of claim 6, wherein the second period of time and the third period of time are substantially equivalent.

8. The method of claim 1, wherein said calibrating comprises using the first temperature and the first slope as a standard and adjusting for differences between the first temperature and the first slope and the second temperature and the second slope.

9. The method of claim 1, further comprising burning in a correction in the second temperature sensor using the calibration.

10. A non-transitory computer accessible memory medium storing program instructions for calibrating integrated circuit temperature sensors, wherein the program instructions are executable by a processor to:
    sense a first temperature using a first temperature sensor and a second temperature using a second temperature sensor, wherein the first temperature sensor is calibrated and is external to a package of the integrated circuit, and wherein the second temperature sensor is included in the integrated circuit;
    increase a temperature of the integrated circuit;

allow the integrated circuit and the package to thermally equilibrate over a first period of time;

sense a first slope of a temperature decay by the first temperature sensor;

sense a second slope of a temperature decay by the second temperature sensor;

compare the first temperature to the second temperature to determine a temperature offset;

compare the first slope to the second slope to determine a slope offset; and calibrate the second temperature sensor using the temperature offset and the slope offset.

11. The memory medium of claim 10, wherein said increase comprises increasing an applied voltage to the integrated circuit such that the temperature of the integrated circuit is increased.

12. The memory medium of claim 10, wherein said increase comprises executing a power intensive program on a processor included in the integrated circuit.

13. The memory medium of claim 10, wherein said calibrate comprises using the first temperature and the first slope as a standard and adjusting for differences between the first temperature and the first slope and the second temperature and the second slope.

14. The memory medium of claim 10, wherein the second temperature sensor is initially uncalibrated.

15. The memory medium of claim 10, wherein said sense a first slope comprises sensing at least a third and a fourth temperature over a second period of time using the first temperature sensor.

16. The memory medium of claim 15, wherein said sense a second slope comprises sensing at least a fifth and a sixth temperature over a third period of time using the second temperatures sensor.

17. The memory medium of claim 16, wherein the second period of time and the third period of time are substantially equivalent.

18. The memory medium of claim 10, wherein the instructions are further executable by the processor to burn in a correction in the second temperature sensor using the calibration.

19. A method for calibrating integrated circuit temperature sensors, comprising:

sensing a first temperature using a first temperature sensor and a second temperature using a second temperature sensor, wherein the first temperature sensor is calibrated and is external to a package of the integrated circuit, and wherein the second temperature sensor is included in the integrated circuit;

increasing a temperature of the integrated circuit comprising increasing an applied voltage to the integrated circuit such that the temperature of the integrated circuit is increased;

allowing the integrated circuit and the package to thermally equilibrate over a first period of time;

sensing a first slope of a temperature decay by the first temperature sensor;

sensing a second slope of a temperature decay by the second temperature sensor;

comparing the first temperature to the second temperature to determine a temperature offset;

comparing the first slope to the second slope to determine a slope offset;

calibrating the second temperature sensor using the temperature offset and the slope offset; and burning in a correction in the second temperature sensor using the calibration.

20. The method of claim 19, wherein said increasing comprises executing a power intensive program on a processor included in the integrated circuit.

* * * * *